US009859867B2

(12) United States Patent
Westmoreland

(10) Patent No.: US 9,859,867 B2
(45) Date of Patent: Jan. 2, 2018

(54) TUNABLE LC FILTER

(71) Applicant: TOSHIBA INTERNATIONAL CORPORATION, Houston, TX (US)

(72) Inventor: David Martin Westmoreland, Houston, TX (US)

(73) Assignee: TOSHIBA INTERNATIONAL CORPORATION, Houston, TX (US)

(*) Notice: Subject to any disclaimer, the term of this patent is extended or adjusted under 35 U.S.C. 154(b) by 0 days.

(21) Appl. No.: 14/796,134

(22) Filed: Jul. 10, 2015

(65) Prior Publication Data

US 2017/0012594 A1 Jan. 12, 2017

(51) Int. Cl.
| | |
|---|---|
| *H03H 7/01* | (2006.01) |
| *H03H 7/42* | (2006.01) |
| *H02M 1/44* | (2007.01) |
| *H03H 1/00* | (2006.01) |
| *H01F 17/06* | (2006.01) |

(52) U.S. Cl.
CPC ............ *H03H 7/427* (2013.01); *H02M 1/44* (2013.01); *H03H 7/0115* (2013.01); *H03H 7/0153* (2013.01); *H01F 17/062* (2013.01); *H03H 1/0007* (2013.01)

(58) Field of Classification Search
CPC .... H03H 7/427; H03H 1/0007; H03H 7/0115; H03H 7/0153; H02M 1/44
USPC ................... 333/174, 81, 121, 12, 181, 175
See application file for complete search history.

(56) References Cited

U.S. PATENT DOCUMENTS

| | | | | |
|---|---|---|---|---|
| 2,884,632 | A * | 4/1959 | De Witz | H01F 21/08 333/17.1 |
| 4,987,390 | A * | 1/1991 | Mouri | H01F 36/00 331/187 |
| 5,247,273 | A * | 9/1993 | Shibayama | H02H 9/042 337/16 |
| 5,831,842 | A | 11/1998 | Ogasawara et al. | |
| 2002/0175571 | A1* | 11/2002 | Gilmore | H01F 17/062 310/45 |

(Continued)

OTHER PUBLICATIONS

NPL Website http://www.circuitcalculator.com/lcfilter.htm ; Nov. 14, 2005.*

(Continued)

*Primary Examiner* — Rakesh Patel
(74) *Attorney, Agent, or Firm* — Westerman, Hattori, Daniels & Adrian, LLP

(57) ABSTRACT

An inductor-capacitor (LC) filter designed to comply with EMC (Electromagnetic Compatibility) standards comprises capacitors; switches for coupling capacitors; differential-mode inductors for coupling capacitors and switches; and common-mode inductors or a combination of differential-mode inductors and common-mode inductors, where an input signal changes the inductance of differential-mode inductors in the LC filter to modify a frequency response of the LC filter. In the LC filter, differential-mode inductors further comprise identical multiple-winding inductors, and the input signal, which biases the plurality of differential-mode inductors, includes a DC signal or a combination of DC and AC signals. A corner-frequency of the LC filter is adjusted and approximated as: $fc=1/(2 \times pi \times sqrt(L \times C))$, where fc is the corner-frequency, L is a composite value of inductance, and C is a composite value of capacitance.

10 Claims, 13 Drawing Sheets

(56) References Cited

U.S. PATENT DOCUMENTS

2012/0014144 A1\* 1/2012 Xu .................. H02M 1/44
363/48
2014/0313795 A1\* 10/2014 Mi .................. H02M 1/44
363/44
2017/0108589 A1\* 4/2017 Doyle ................. G01S 19/37

OTHER PUBLICATIONS

Common Mode Filter Design Guide, Nov. 8, 2007, Document 191-1, Coilcraft, Cary, IL (4 pages).
Welday Gebremedihn Gerekial, Bi-directional power converters for smart grids: Isolated bidirectional DC-DC converter, Jun. 2014, Norwegian University of Science and Technology (108 pages).
Choi, Hangseok, Ph.D., Half-Bridge LLC Resonant Converter Design Using FSFR-Series Fairchild Power Switch, Oct. 22, 2014, Rev. 1.0.2, Fairchild Semiconductor Corporation (18 pages).

\* cited by examiner

# TUNABLE LC FILTER

BACKGROUND

Line filters are used to prevent excessive noise from being conducted between electronic equipment and AC line (Document 1). FIG. 1 shows the use of a common-mode filter (1a) between the AC line (1) and a power converter (2) (Document 1). In FIG. 1, the direction of common-mode noise is from the load and into the filter, and the noise common to both lines becomes attenuated, making the resulting common-mode output of the filter onto the AC line negligible (Document 1).

FIG. 2 shows a common-mode inductor. The design of a common-mode filter is the design of two identical differential filters, one for each of the two polarity lines with the inductors of each side coupled by a single core (Document 1). For a differential input current ((A; 3) to (B; 4) through L1 (5) and (B) to (A) through L2 (6)), the net magnetic flux, coupled between the two inductors L1 and L2, is zero (Document 1). Any inductance encountered by the differential input signal is the result of imperfect coupling of the two chokes, and they perform as independent components with their leakage inductances responding to the differential signal (Document 1). The leakage inductances attenuate the differential signal (Document 1). When the inductors encounter an identical signal of the same polarity referred to ground (common-mode signal), they each contribute a net, non-zero flux in the shared core, the inductors thus perform as independent components with their mutual inductance responding to the common signal, and the mutual inductance then attenuates this common signal (Document 1).

The simplest and least expensive filter is a first order filter (Document 1). This first order filter uses a single reactive component to store certain bands of a spectral energy without passing this energy to the load (Document 1). In case of a low pass common-mode filter, a common-mode choke is the reactive element employed (Document 1). Here, the value of inductance (L; 7) required of the choke is the load (in Ohms; 8) divided by the radian frequency at and above which the signal is to be attenuated (Document 1), which is represented by the following relationship:

$$L = \frac{R_L}{\omega},$$

wherein $\omega$ is a radian frequency, and $R_L$ is the noise load resistance. FIG. 3 shows a first order common-mode filter.

A second order filter is designed to use two reactive components and has two advantages over the first order filter: provides 12 dB over octave attenuation after the cutoff point; and provides greater attenuation at frequencies above inductor self-resonance (Document 1). FIG. 4 shows a second order common-mode filter. The second order common-mode filter in FIG. 4 has the following relationship (relationship between $V_{CM_{OUT}}$ (9) and $V_{CM_{IN}}$ (10)):

$$\frac{V_{CM_{OUT}}(s)}{V_{CM_{IN}}(s)} = \frac{1}{1 + \frac{L}{R_L}s + LCs^2} = \frac{1}{1 + j2\zeta\frac{\omega}{\omega_n} - \left(\frac{\omega}{\omega_n}\right)^2} = \frac{1}{1 - LC\omega^2 + j\omega\left(\frac{L}{R_L}\right)},$$

where $\omega$ is a radian frequency, $R_L$ is the noise load resistance, $$\omega_n = \frac{1}{\sqrt{LC}}m$$

and $$\zeta = \frac{L}{2R_L\sqrt{LC}}.$$

A third order filter is designed to use three reactive components and yields an attenuation of 18 db per octave above the cutoff point. However, since it has to use three reactive components, it is highly expensive (Document 1). FIG. 5 shows a third order common-mode filter. The third order common-mode filter in FIG. 5 has the following relationship (relationship between $V_{CM_{OUT}}$ (11) and $V_{CM_{IN}}$ (12)):

$$\frac{V_{CM_{OUT}}(s)}{V_{CM_{IN}}(s)} = \left(\frac{R_L}{R_L + L_2 s}\right)\left(\frac{\frac{R_L + L_2 s}{sC}}{\frac{R_L + L_2 s}{sC} + R_L L_1 s + L_2 L_1 s + L_2 L_1 s^2 + \frac{L_1 s}{sC}}\right) = \frac{1}{1 + \frac{L_1 + L_2}{R_L}s + L_1 C s^2 + \frac{L_1 L_2 C}{R_L}s^3}.$$

It is noted that filters with higher than third order are general cost-prohibitive (Document 1).

In order to consolidate and be complied with the EMC (Electromagnetic Compatibility) standard, a filter targeted to reduce the quantity of unique fixed-corner-frequency physical LC (inductor-capacitor) filter is necessary. The filter needs to have an adjustable corner-frequency frequency. Also, a corner-frequency of the filter needs to be adjusted to emulate multiple fixed-corner-frequency filters.

However, none of the filters in the market is related to current- or voltage-tunable EMC filters. While there is a filter in the market, which uses Varactor diodes to provide an adjustable capacitance to help tune radio-frequency receivers, the proposed filter changes the value of inductance, not capacitance to tune the filter, and the proposed filter is applied to implement the EMC filtering, not radio-wave reception.

In order to solve the above-mentioned and/or other problems, the present invention describes a tunable LC filter, which reduces the number of unique fixed-corner-frequency physical LC filters by providing an adjustable corner-frequency characteristic, and which can be tuned by using fixed or variable current (DC/AC signals) to change an inductance of a common-mode choke.

SUMMARY

The preferred embodiments overcome the above and/or other problems. In accordance with some embodiments, an inductor-capacitor (LC) filter comprises a plurality of capacitors; a plurality of switches for coupling the plurality of capacitors; and a plurality of differential-mode inductors for coupling the plurality of capacitors and the plurality of switches, wherein an input signal changes an inductance of the plurality of differential-mode inductors in the LC filter to modify a frequency response of the LC filter. In the LC filter, the plurality of differential-mode inductors further comprise a plurality of identical multiple-winding inductors, and the input signal includes a DC (direct current) signal or a combination of DC and AC (alternating current) signals, wherein the input signal biases the plurality of differential-mode inductors. The LC filter further comprises a plurality of common-mode inductors or a combination of the plurality of differential-mode inductors and the plurality of common-mode inductors. In addition, a corner-frequency of the LC filter is adjusted and approximated as: fc=1/(2×pi×sqrt(L× C)), wherein fc is the corner-frequency of the LC filter; L is a composite value of inductance of the LC filter; and C is a composite value of capacitance of the LC filter. Furthermore, the LC filter is designed to assist the filtered equipment to comply with EMC (Electromagnetic Compatibility) standards. Other embodiments of the LC filter may also be used to filter undesirable signals from the output of an Inverter system or input of a PFC (power factor correction) Converter system, thereby reducing Total Harmonic Distortion (THD) and/or carrier-induced Voltage and current ripple. Embodiments of the filter may be applied inside a LLC (inductor-inductor-capacitor) Converter network where the adjustable inductance is a set of differential-mode inductors (Ldiff) operated as an adjustable-inductive element or the adjustable inductance is incorporated into the design of the LLC transformer or a combination of both Ldiff and transformer (Document 3, Page 1). The inclusion of the tunable filter network into the LLC converter could serve to adjust the resonant frequency in response to the converter's changing line and load conditions. This resonant frequency change could facilitate a reduction in power losses in the switch(es) (Document 2, Sec 2.6.1, $2^{nd}$ paragraph) and/or a reduction in EMI emissions, and/or compensate for a substitution of power switch(es) having different values of parasitic capacitances than the original switch(es), and/or compensate for a substitution of the series capacitance having a different value or tolerance than the original part.

In accordance with some embodiments, the LC filter comprises a plurality of capacitors; a plurality of switches for coupling the plurality of capacitors; and a plurality of common-mode inductors for coupling the plurality of capacitors and the plurality of switches, wherein an input signal changes an inductance of the plurality of common-mode inductors in the LC filter to modify a frequency response of the LC filter. In the LC filter, the plurality of common-mode inductors further comprise a 2-winding common-mode inductor or a 3-winding common-mode inductor, and the input signal includes a DC (direct current) signal or a combination of DC and AC (alternating current) signals, wherein the input signal biases the plurality of common-mode inductors. The LC filter further comprises a plurality of differential-mode inductors or a combination of the plurality of differential-mode inductors and the plurality of common-mode inductors. In addition, a corner-frequency of the LC filter is adjusted and approximated as: fc=1/(2×pi× sqrt(L×C)), wherein fc is the corner-frequency of the LC filter; L is a composite value of inductance of the LC filter; and C is a composite value of capacitance of the LC filter. Furthermore, the LC filter is designed to comply with EMC (Electromagnetic Compatibility) standards.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/ or advantages of particular embodiments should not be construed as limiting other embodiments or the claims.

BRIEF DESCRIPTION OF THE DRAWINGS

For a better understanding of the aforementioned embodiments of the invention as well as additional embodiments thereof, reference should be made to the Description of Illustrative Embodiments below, in conjunction with the following drawings in which like reference numerals refer to corresponding parts throughout the figures.

DESCRIPTION OF ILLUSTRATIVE EMBODIMENTS

Reference will now be made in detail to embodiments, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details. In other instances, well-known methods, procedures, components, circuits, and networks have not been described in detail so as not to unnecessarily obscure aspects of the embodiments.

First Embodiment

Figure 1:
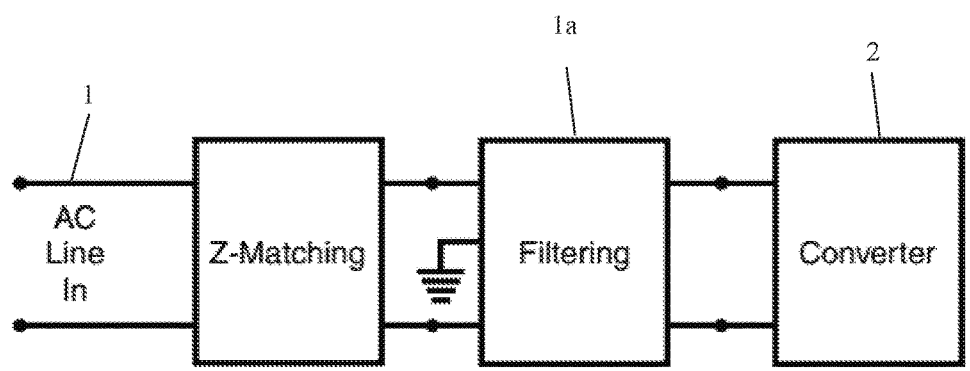
FIG. 1 illustrates the use of a common-mode filter between an AC line and a power converter in accordance with some embodiments.
Figure 2:
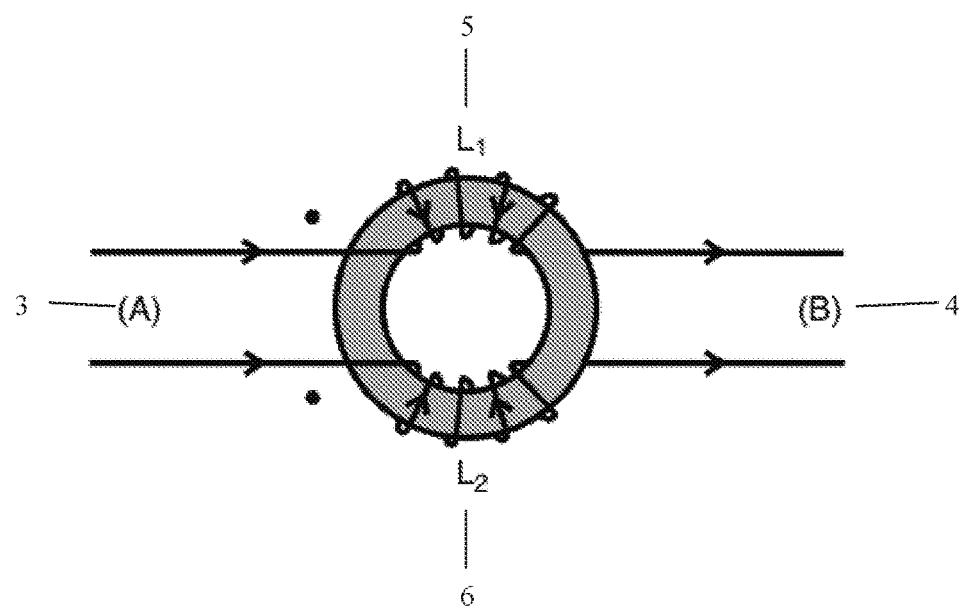
FIG. 2 illustrates a common-mode inductor in accordance with some embodiments.
Figure 3:
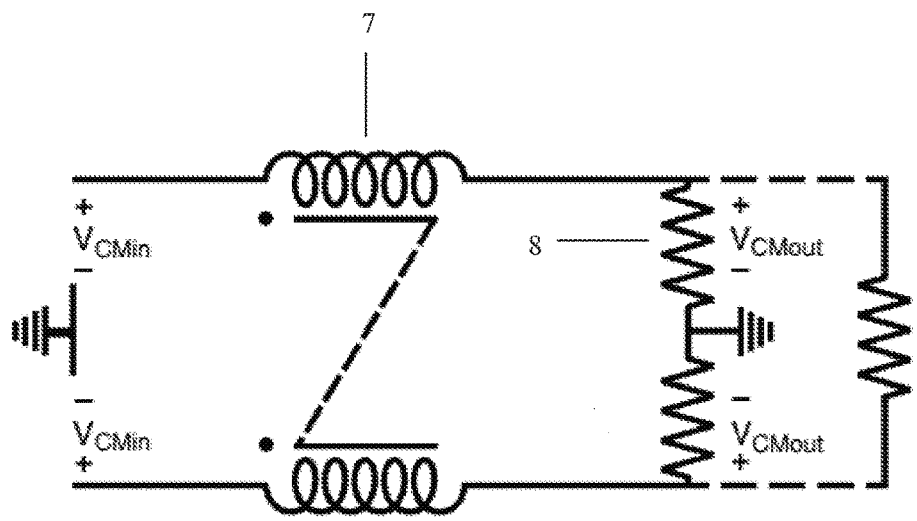
FIG. 3 illustrates a first order common-mode filter in accordance with some embodiments.
Figure 4:
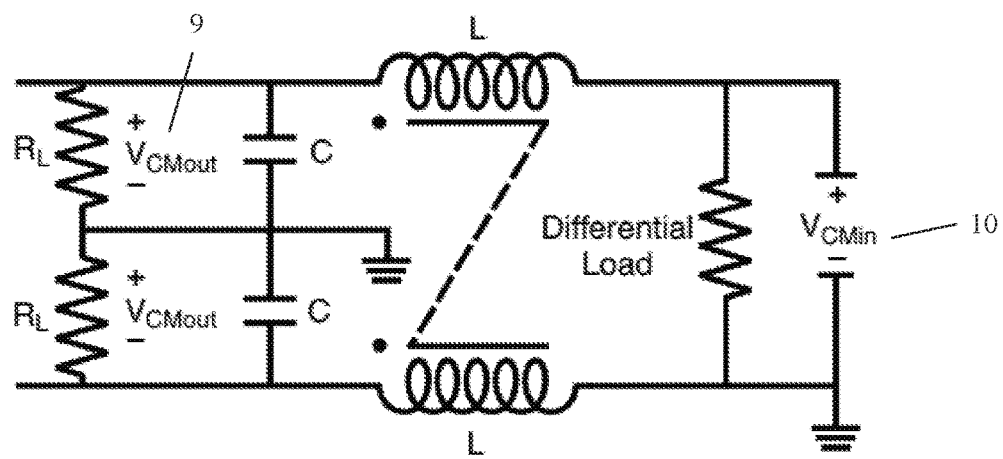
FIG. 4 illustrates a second order common-mode filter in accordance with some embodiments.
Figure 5:
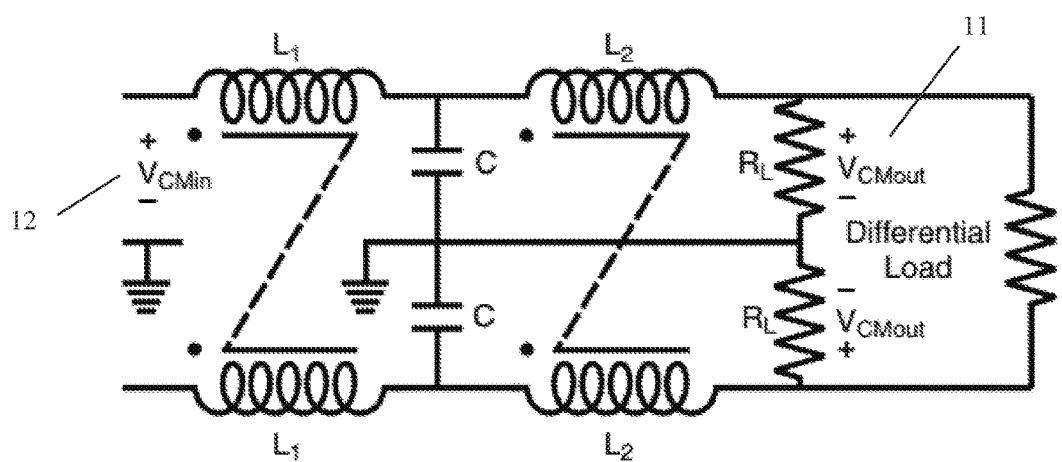
FIG. 5 illustrates a third order common-mode filter in accordance with some embodiments.
Figure 6:
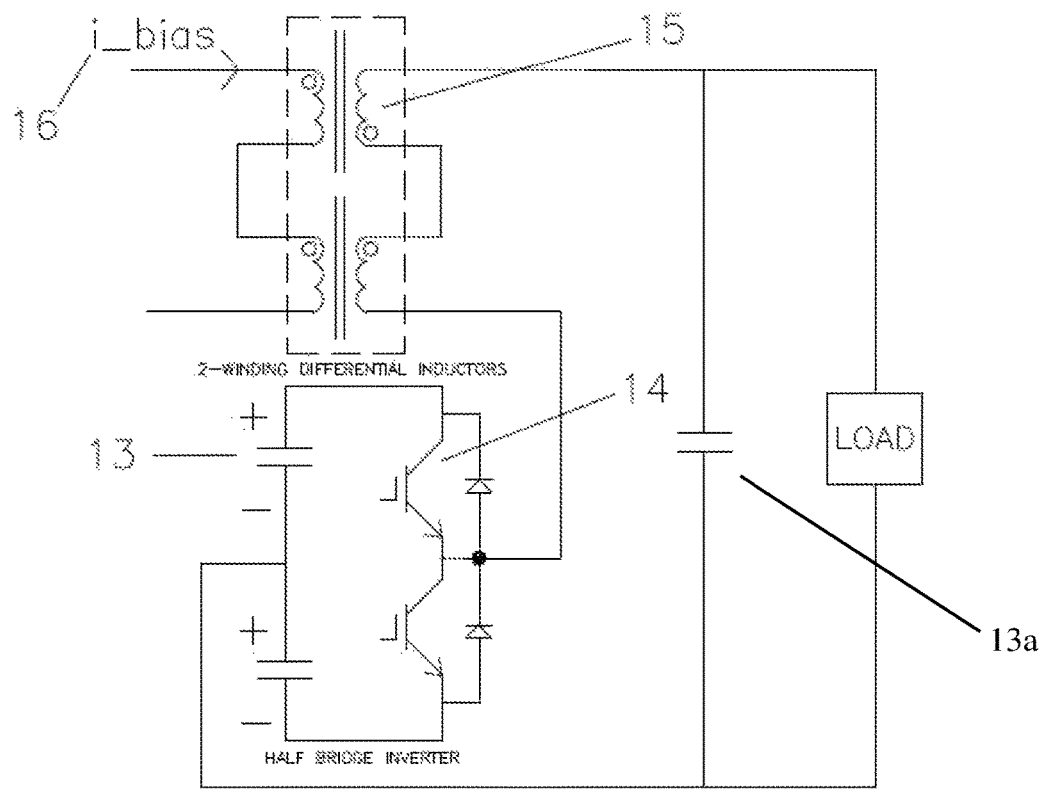
FIG. 6 illustrates a circuit diagram for a differential-mode choke implementation in accordance with the first embodiment.

FIG. 6 illustrates a circuit diagram for a differential-mode choke implementation. This circuit diagram presents two identical multiple-winding inductors. The LC filter in FIG. 6 comprises a half-bridge converter network including series connected capacitors (13) & switches (14), a plurality of differential-mode inductors (15), and a filter capacitor (13a). An input signal (16) changes an inductance of the plurality of differential-mode inductors in the LC filter to modify a frequency response of the LC filter. The plurality of differential-mode inductors further comprises a plurality of identical multiple-winding inductors. The input signal includes a DC signal or a combination of DC and AC signals and biases the plurality of differential-mode inductors. Furthermore, the plurality of differential-mode inductors within the LC filter further function as a plurality of common-mode inductors.

A corner-frequency of the LC filter is adjusted and approximated as:

$$fc = 1/(2 \times pi \times sqrt(L \times C)),$$

where fc is the corner-frequency of the LC filter, L is a composite value of inductance of the LC filter, and C is a composite value of capacitance of the LC filter. Here, the composite value of inductance (L) is calculated by adding inductance values of multiple inductors in series. Similarly, the composite value of capacitance (C) is calculated by adding capacitance values of multiple capacitors in parallel. It is noted that practical inductors can have inductances that vary with current through inductor(s) coils, so a series combination needs to address the inductance-versus-current characteristics of each inductor. Other effects such as frequency of the imposed current and core temperature can alter the inductance. Similarly, capacitors can have voltage, frequency, and temperature dependences.

Figure 10:
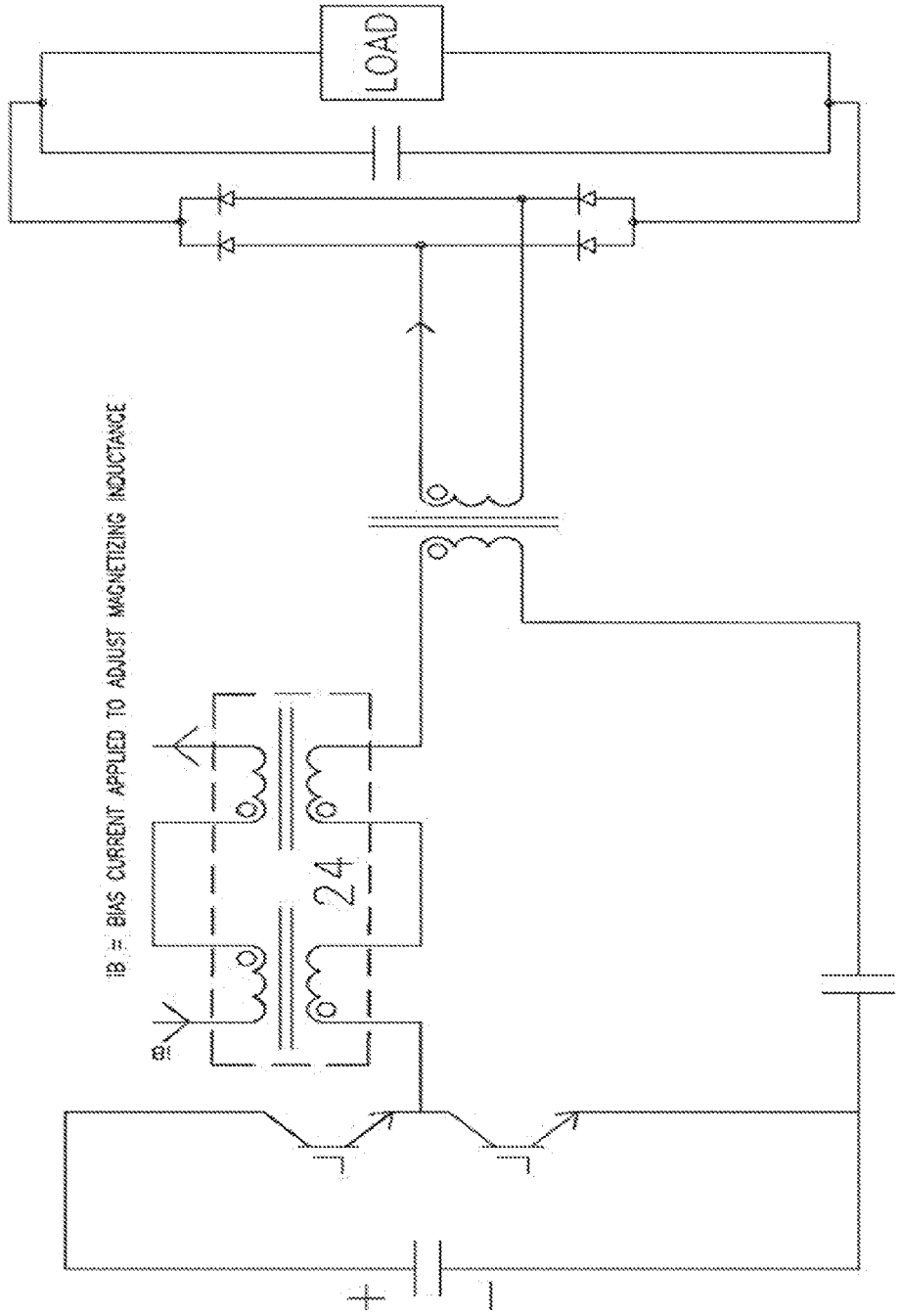
FIG. 10 illustrates a circuit diagram for a LLC resonant converter having an adjustable series inductance in accordance with some embodiments.
Figure 11:
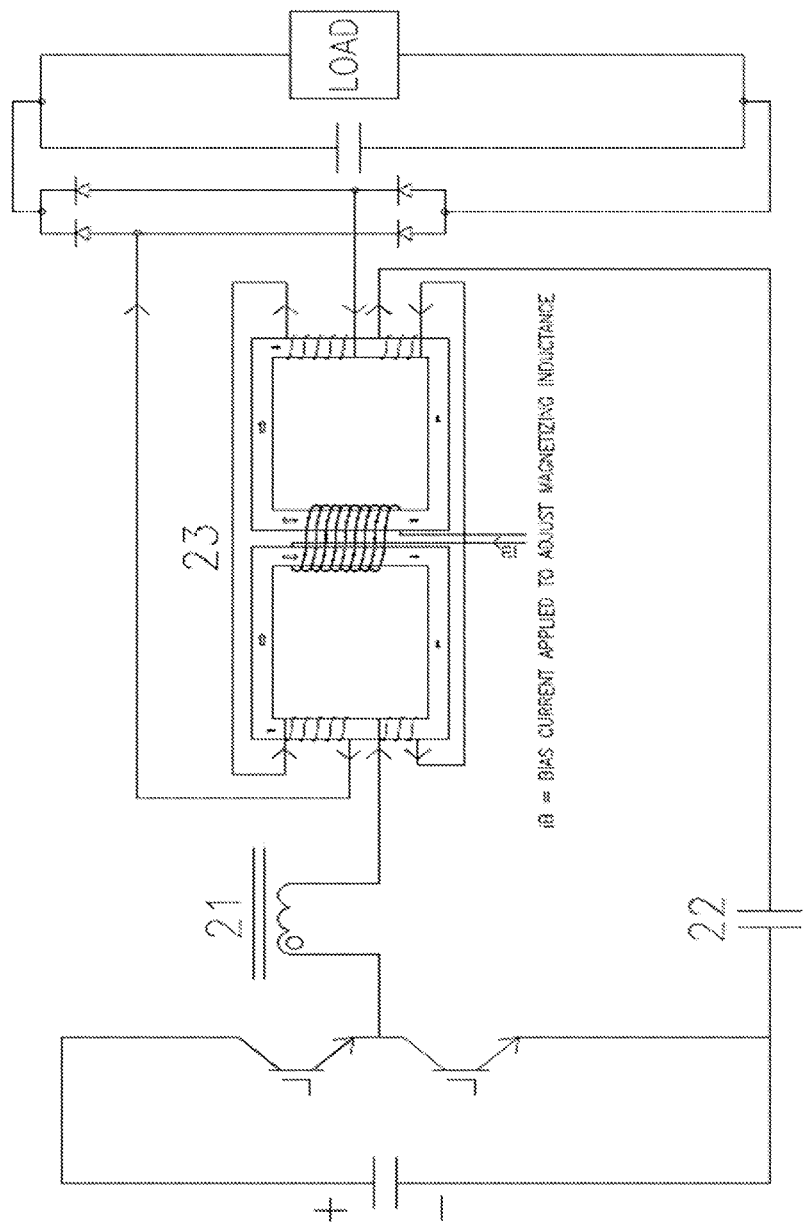
FIG. 11 illustrates a circuit diagram for a LLC resonant converter having an adjustable magnetizing inductance in accordance with some embodiments.

FIGS. 10 and 11 illustrate the application of the adjustable differential inductor to adjust a resonant frequency of a LLC resonant converter for the purpose of reducing power losses in the switches, and/or reducing EMI emissions, and/or compensating for variations in component parameters. 24 in FIG. 10 is a set of differential inductors configured as a current-bias variable inductance. 21 in FIG. 11 is the series inductor, usually denoted L-sub-r (Document 3, Page 1), 22 is the series capacitor, usually denoted C-sub-r, and 23 is the LLC transformer configured to present an adjustable value of inductance via a current bias winding. The inductance imposed by the transformer has been designated L-sub-shunt or L-sub-m in Document 3, Page 1.

Figure 12:
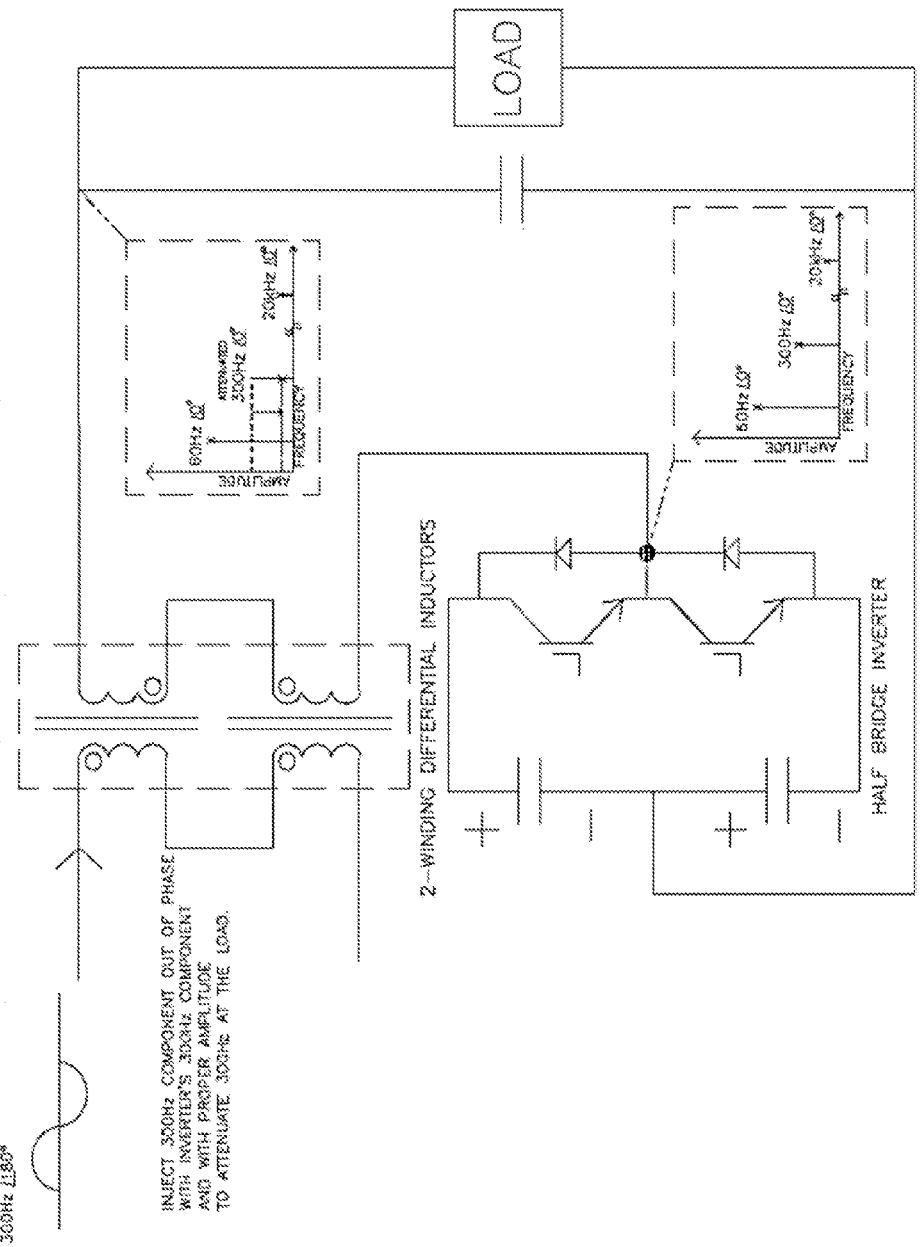
FIG. 12 illustrates a circuit diagram based on FIG. 6 illustrating an Inverter filtering application in accordance with some embodiments.
Figure 13:
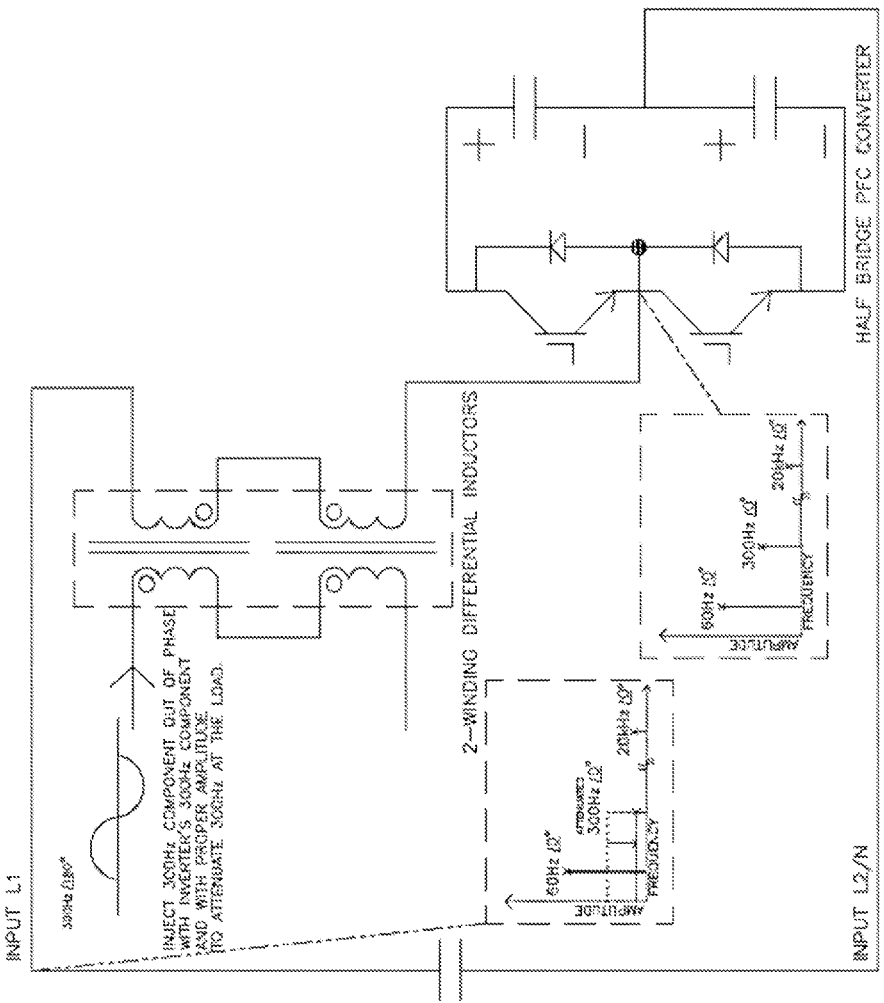
FIG. 13 illustrates a circuit diagram based on FIG. 6 illustrating a PFC Converter filtering application in accordance with some embodiments.

FIGS. 12 and 13 illustrate the application of the differential-inductor-based filter toward reducing harmonics and/or carrier components from the output of an Inverter or from being imposed onto the input side of a PFC converter.

Second Embodiment

The LC filter in accordance with the second embodiment comprises a plurality of capacitors; a plurality of switches for coupling the plurality of capacitors; and a plurality of common-mode inductors for coupling the plurality of capacitors and the plurality of switches. Here, an input signal changes an inductance of the plurality of common-mode inductors in the LC filter to modify a frequency response of the LC filter. The plurality of common-mode inductors further comprise a 2-winding common-mode inductor or a 3-winding common-mode inductor. The input signal biases the plurality of common-mode inductors. Furthermore, the LC filter further comprises a plurality of differential-mode inductors or a combination of the plurality of differential-mode inductors and the plurality of common-mode inductors.

The explanation on common components between the first and second embodiments is omitted.

Figure 7:
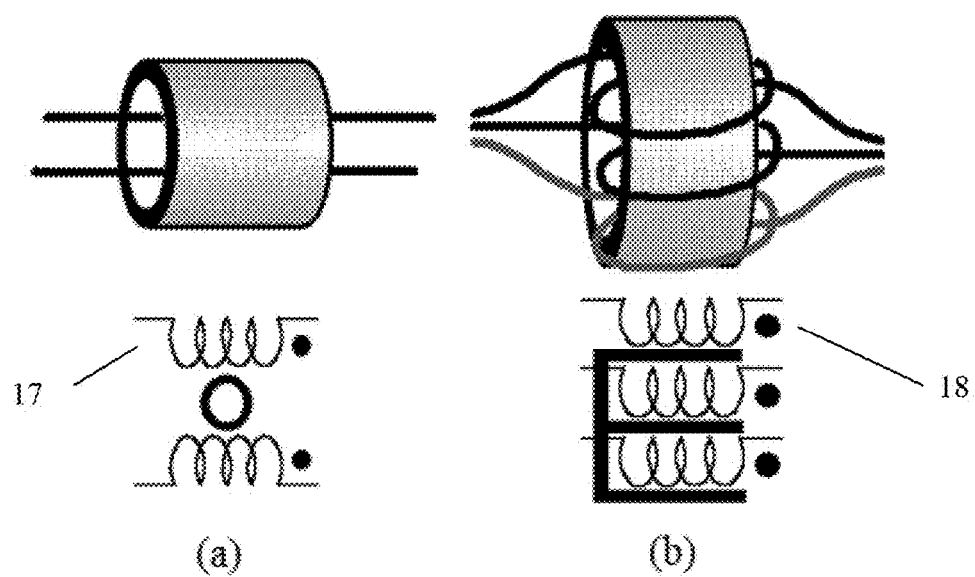
FIG. 7 illustrates (a): a 2-winding (2-coil) common-mode inductor (2-circuit common-mode choke) and (b): a 3-winding (3-coil) common-mode inductor (3-circuit common-mode choke) in accordance with some embodiments.

FIG. 7 illustrates (a): a 2-winding (2-coil) common-mode inductor ("2-circuit common-mode choke"; 17) and (b): a 3-winding (3-coil) common-mode inductor ("3-circuit common-mode choke"; 18). A common-mode choke is an inductor, where all the relevant conductors are wound together around the same core.

Figure 8:
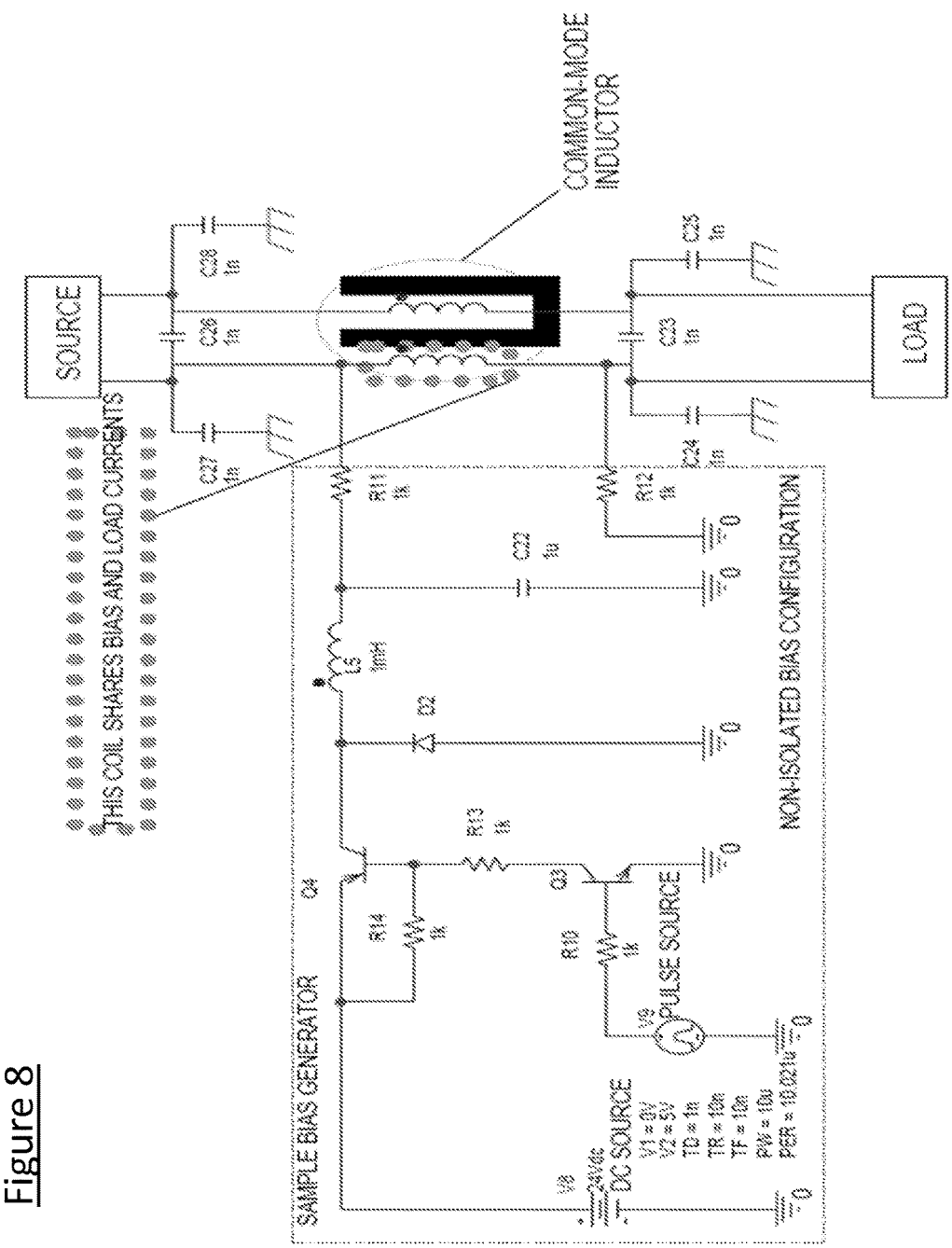
FIG. 8 illustrates a circuit diagram for a tunable LC filter with a 2-winding (2-coil) common-mode inductor in accordance with some embodiments.

FIG. 8 illustrates a circuit diagram for a tunable LC filter with a 2-winding (2-coil) common-mode inductor. FIG. 8 shows how one of the coils employed in the 2-winding common-mode inductor (19) shares signals between the bias and power circuits. This configuration couples the bias and power circuits electrically, i.e., they are not electrically isolated. The bias and power circuits share a common electrical point, and this lack of isolation may restrict how the bias circuit is constructed and where/how the common-mode coil may be used. But, the 2-winding common-mode inductors are common and thus tend to be more economical due in part to higher volume of usage.

Figure 9:
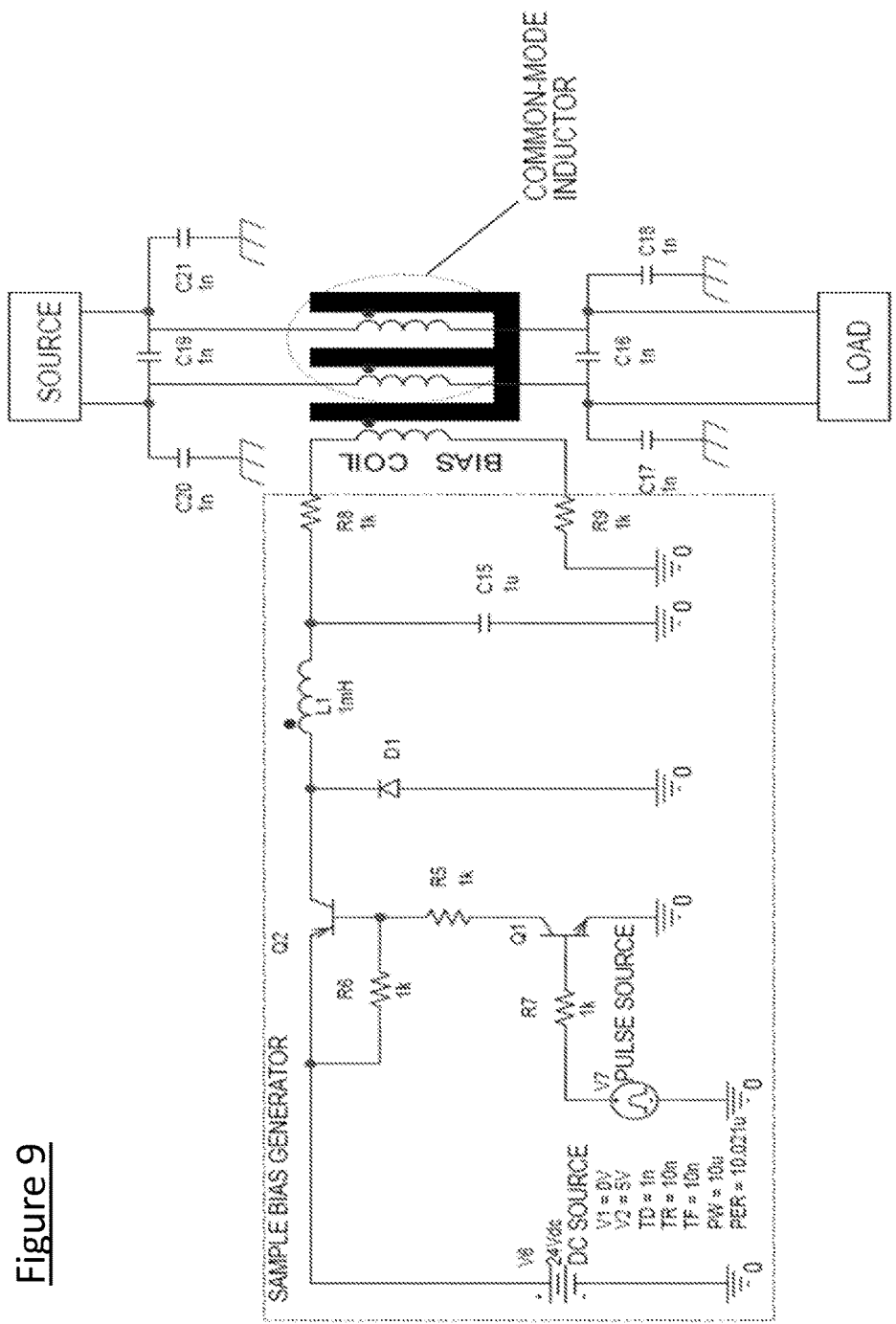
FIG. 9 illustrates a circuit diagram for a tunable LC filter with a 3-winding (3-coil) common-mode inductor in accordance with some embodiments.

FIG. 9 illustrates a circuit diagram for a tunable LC filter with a 3-winding (3-coil) common-mode inductor. The 3-winding common-mode inductor (20) in FIG. 9 employs 2 windings for power filter and 1 winding for bias. It is less common, thus could be more expensive, but affords flexibility for the bias circuit design and power circuit connections. The 3-winding common-mode inductors have been used in 3-phase systems and provide a starting point for a 3-coil version of the adjustable inductor-based EMC filter.

Advantageous Effects

In some illustrative implementations, the LC filters in the first and second embodiments reduce and spread EMC spectral peaks by transferring some energy to sidebands made from the interaction of the bias signal with the carrier (peak-generating) signal over time. In addition, the LC filters help attenuate EMC signals that respond to variations in loading. Furthermore, the LC filters are capable of using the same bias circuit to monitor for changes in the filters' and filters' load's ground-leakage current. That is, the LC filters can sense ground faults for safety purposes.

The present invention can be extended to include the LC filter is used to stabilize by adding the current bias to the inductors to minimize the effects of temperature and other environmental variations on the performance of the filter.

Broad Scope of the Invention

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure, the following abbreviated terminology may be employed: "e.g." which means "for example."

What is claimed is:

1. An inductor-capacitor (LC) filter comprising:
   a plurality of capacitors;
   a plurality of switches for coupling the plurality of capacitors directly; one or more of the plurality of switches are connected in series with one or more of the plurality of capacitors;
   a plurality of differential-mode inductors for coupling the plurality of capacitors and the plurality of switches directly,
   wherein an input signal changes an inductance of the plurality of differential-mode inductors in the LC filter to modify a frequency response of the LC filter,
   wherein the input signal includes a DC (direct current) signal or a combination of DC and AC (alternating current) signals,
   wherein the LC filter is tuned by the input signal, and a corner-frequency of the LC filter is adjusted to multiple values, where each value imitates a corresponding fixed-corner-frequency filter in the LC filter, and
   wherein the LC filter is designed to comply with EMC (Electromagnetic Compatibility) standards and reduces and spreads EMC spectral peaks by transferring energy of the EMC spectral peaks to sidebands of the LC filter.

2. The LC filter according to claim 1, wherein the plurality of differential-mode inductors comprises a plurality of identical multiple-winding inductors.

3. The LC filter according to claim 1, wherein the corner-frequency of the LC filter is adjusted and approximated as:

$$fc=1/(2\times pi\times sqrt(L\times C)),$$

wherein fc is the corner-frequency of the LC filter;
L is a composite value of inductance of the LC filter; and
C is a composite value of capacitance of the LC filter.

4. The LC filter according to claim 1, wherein the input signal biases the plurality of differential-mode inductors.

5. The LC filter according to claim 1, wherein the plurality of differential-mode inductors further function as a plurality of common-mode inductors.

6. An inductor-capacitor (LC) filter comprising:
   a plurality of capacitors;
   a plurality of switches for coupling the plurality of capacitors directly; one or more of the plurality of switches are connected in series with one or more of the plurality of capacitors;
   a plurality of common-mode inductors for coupling the plurality of capacitors and the plurality of switches directly,
   wherein an input signal changes an inductance of the plurality of common-mode inductors in the LC filter to modify a frequency response of the LC filter,
   wherein the input signal includes a DC (direct current) signal or a combination of DC and AC (alternating current) signals,
   wherein the LC filter is tuned by the input signal, and a corner-frequency of the LC filter is adjusted to multiple values, where each value imitates a corresponding fixed-corner-frequency filter in the LC filter, and
   wherein the LC filter is designed to comply with EMC (Electromagnetic Compatibility) standards and reduces and spreads EMC spectral peaks by transferring energy of the EMC spectral peaks to sidebands of the LC filter.

7. The LC filter according to claim 6, wherein the corner-frequency of the LC filter is adjusted and approximated as:

$$fc=1/(2\times pi\times sqrt(L\times C)),$$

wherein fc is the corner-frequency of the LC filter;
L is a composite value of inductance of the LC filter; and
C is a composite value of capacitance of the LC filter.

8. The LC filter according to claim 6, wherein the plurality of common-mode inductors further function as a plurality of differential-mode inductors.

9. The LC filter according to claim 6, wherein the plurality of common-mode inductors comprise a 2-winding common-mode inductor or a 3-winding common-mode inductor,
   wherein the 2-winding common-mode inductor has 2 coils and the 3-winding common-mode inductor has 3 coils.

10. The LC filter according to claim 6, wherein the input signal biases the plurality of common-mode inductors.

* * * * *